United States Patent
Takata (10) Patent No.: US 7,243,181 B2
(45) Date of Patent: Jul. 10, 2007

(54) SIGNAL BUS ARRANGEMENT

(75) Inventor: Hidehiro Takata, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 105 days.

(21) Appl. No.: 11/231,748

(22) Filed: Sep. 22, 2005

(65) Prior Publication Data

US 2006/0020734 A1    Jan. 26, 2006

Related U.S. Application Data

(62) Division of application No. 10/147,989, filed on May 20, 2002, now Pat. No. 6,959,353.

(30) Foreign Application Priority Data

Jun. 20, 2001 (JP) ............................. 2001-186319

(51) Int. Cl.
*G06F 13/14* (2006.01)
*H01R 12/34* (2006.01)
(52) U.S. Cl. .................. 710/305; 712/33; 439/497
(58) Field of Classification Search ............ 710/22–28, 710/30, 31, 305, 308; 712/33; 439/497, 439/498
See application file for complete search history.

(56) References Cited

U.S. PATENT DOCUMENTS

| | | | | |
|---|---|---|---|---|
| 5,283,390 A | * | 2/1994 | Hubis et al. | .................. 174/36 |
| 5,414,866 A | | 5/1995 | Ohmae | |
| 5,574,250 A | * | 11/1996 | Hardie et al. | ................. 174/36 |
| 5,664,125 A | | 9/1997 | Vater | |

FOREIGN PATENT DOCUMENTS

JP    6-131084    5/1994

OTHER PUBLICATIONS

Differential Signaling, Lattice Semiconductor Corporation, May 2001.*

* cited by examiner

*Primary Examiner*—Khanh Dang
(74) *Attorney, Agent, or Firm*—McDermott Will & Emery LLP (57) ABSTRACT

In a two-dimensional layout, the bus signal lines are arranged such that adjacent signal lines are of different buses. The different buses transmit signals changed at different timings. The signal lines of the same buses transmit signals changed substantially at the same timing. Thus, cross-talk noise between signal lines can be reduced without widening a bus line pitch.

7 Claims, 8 Drawing Sheets

SIGNAL BUS ARRANGEMENT

RELATED APPLICATIONS

This application is a divisional of application Ser. No. 10/147,989, filed May 20, 2002 now U.S. Pat. No. 6,959,353, which claims priority of Japanese Application No. 2001-186319, filed Jun. 20, 2001, the contents of which are hereby incorporated by reference.

BACKGROUND OF THE INVENTION

1. Field of the Invention

The present invention relates to the physical arrangement of signal lines transmitting signals between devices, and particularly relates to the physical arrangement of a plurality of signal buses each including a plurality of signal lines. More specifically, the present invention relates to a bus arrangement for reducing cross-talk noise between signal lines.

2. Description of the Background Art

Figure 10:
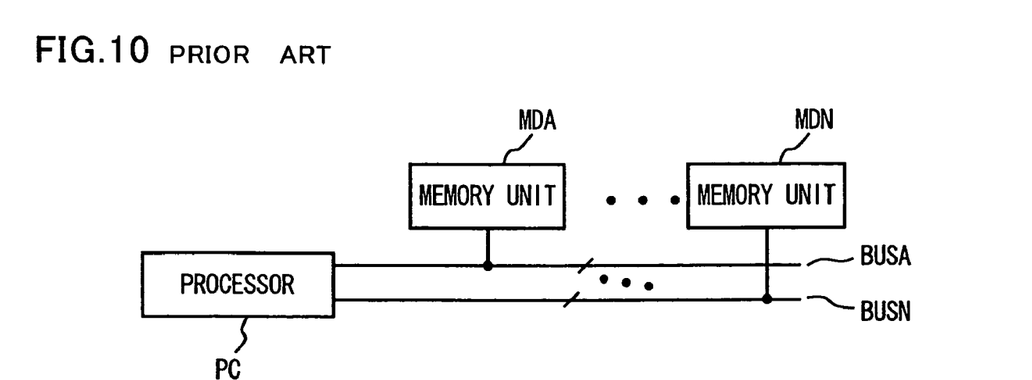
FIG. 10 is a schematic diagram of the construction of a conventional processing system.

FIG. 10 shows an example of the constitution of a conventional processing system. In FIG. 10, the processing system includes a processor PC and memory units MDA to MDN coupled to processor PC through buses BUSA to BUSN, respectively. Each of buses BUSA to BUSN includes an address bus transmitting address signals, a control bus transmitting control signals and a data bus transmitting data.

Figure 11:
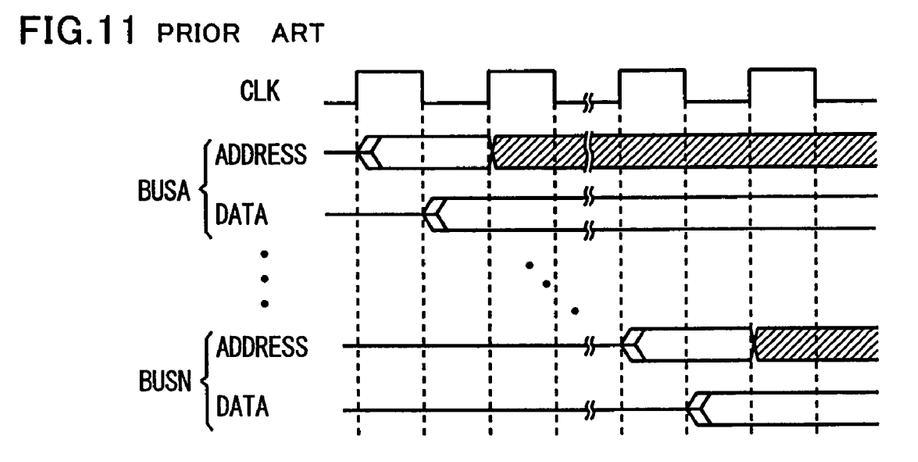
FIG. 11 is a timing chart representing an operation of the processing system shown in FIG. 10.

FIG. 11 is a timing chart representing an operation of the processing system shown in FIG. 10. In an operation sequence shown in FIG. 11, data is transmitted between processor PC and memory units MDA to MDN synchronously with a master clock signal CLK in this processing system.

As shown in FIG. 11, processor PC accesses memory units MDA to MDN at different timings (or in different clock cycles) synchronously with the clock signal. In FIG. 11, in response to the rises of clock signal CLK, processor PC transmits address signals to memory units MDA to MDN, respectively, and in response to the fall of clock signal CLK, data is read from memory units MDA to MDN accessed by processor PC. Accordingly, by providing individual buses BUSA to BUSN for memory units MDA-MDN, respectively and by sequentially accessing the buses, data is transmitted in a pipeline manner to achieve high-speed data transmission.

Memory units MDA to MDN may be the same in construction or may be different in type.

With bus connection switched in processor PC, processor PC can transfer data to memory units MDA to MDN in a pipeline manner and can process the data internally in a pipeline manner. In addition, during an internal operation of processor PC, processor PC can access memory units MDA to MDN so as to transmit necessary data thereto. It is, therefore, possible to effectively eliminate wait time in memory access to achieve a processing system capable of processing data at high speed.

Figure 12:
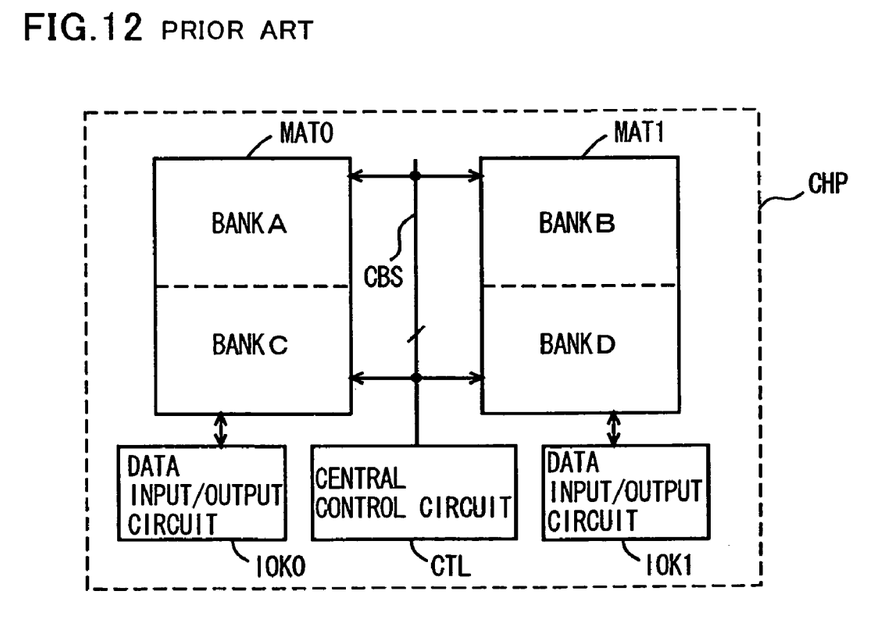
FIG. 12 is a schematic diagram showing an example of the construction of a conventional semiconductor integrated circuit device.

FIG. 12 shows an example of the construction of a conventional semiconductor integrated circuit device. In FIG. 12, this semiconductor integrated circuit device CHP is a semiconductor memory device formed on a single semiconductor chip. Semiconductor integrated circuit device CHP includes memory mats MAT0 and MAT1 each having a plurality of memory cells. Memory mat MAT0 includes banks A and C while memory mat MAT1 includes banks B and D. Banks A to D can be driven into a selected state (in which a word line is selected) independently of one another.

Further, semiconductor integrated circuit device CHP includes a central control circuit CTL transmitting an internal address signal and a control signal through an internal bus CBS to each of banks A to D in accordance with an external address signal and an external control signal which are not shown, a data input/output circuit IOK0 inputting and outputting data to and from a selected memory cell in banks A and C, and a data input/output circuit IOK1 inputting and outputting data to and from a selected memory cell in banks B and D.

The internal address signal and the internal control signal are transmitted from central control circuit CTL to each bank through the internal bus CBS and each of banks A to D is driven into a selected state in accordance with the transmitted signals. Inputting/outputting of data is executed for one bank in a selected state.

In semiconductor integrated circuit device CHP as stated above, by providing a plurality of banks A to D and interleavingly accessing banks A to D to thereby avoid the overhead in address transfer, it is possible to achieve high-speed data transmission. Further, by driving a bank into a selected state while selecting and accessing another bank, it is possible to reduce overhead in the switching-over of banks or switching-over of pages.

In each of the processing system shown in FIG. 10 and the semiconductor integrated circuit device shown in FIG. 12, signal buses BUSA to BUSN and internal data bus CBS are arranged. Each of these buses BUSA to BUSN and CBS has a width of a plurality of bits. Buses BUSA to BUSN are formed of on-board wirings or printed wirings and internal bus CBS is constituted of on-chip internal interconnection lines.

Figure 13A:
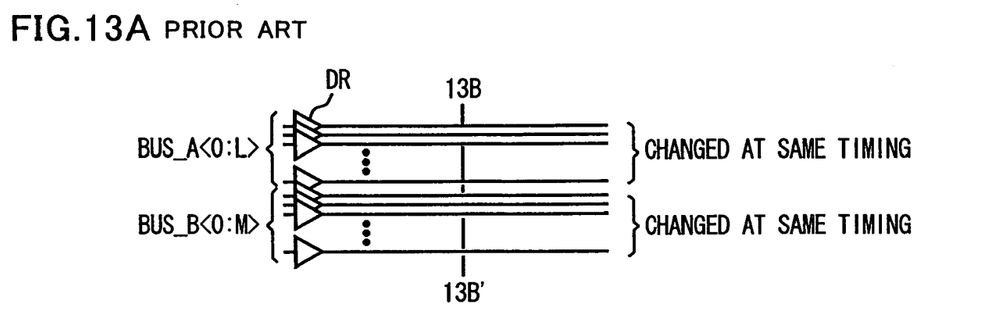
FIG. 13A is a schematic diagram of the two-dimensional layout of a conventional signal bus arrangement.
Figure 13B:
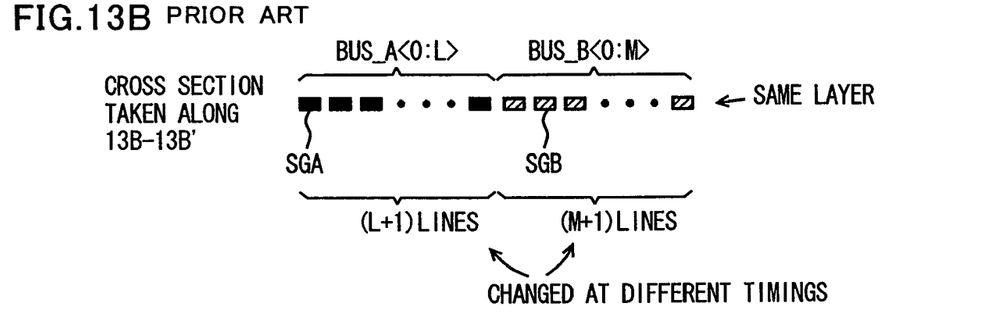
FIG. 13B is a schematic diagram of a cross-sectional structure along line 13B–13B' of FIG. 13A.

FIGS. 13A and 13B are schematic diagrams of a conventional bus signal line arrangement. FIG. 13A typically shows a signal bus BUSA including bus lines BUS_A<0:L> of a width of (L+1) bits and signal bus BUSB including bus lines BUS_B<0:M> of a width of (M+1) bits. Drivers DR are provided for driving the signal lines of bus lines BUS_A<0:L> and BUS_B<0:M>, respectively. These drivers DR are normally operated synchronously with clock signal CLK.

FIG. 13B is a schematic diagram of a cross-sectional structure taken along line 13B–13B' of FIG. 13A. As shown in FIG. 13B, bus lines BUS_A<0:L> and BUS_B<0:M> include signal interconnection lines SGA and SGB, respectively. Signal interconnection lines SGA of bus lines BUS_A<0:L> are arranged to be adjacent one another and signal interconnection lines SGB of bus lines BUS_B<0:L> are arranged to be adjacent one another.

That is, bus lines BUS_A<0:L> and BUS_B<0:M> are arranged collectively in units of buses. Signal interconnection lines SGA and SGB of bus lines BUS_A<0:L> and BUS_B<0:L> are arranged on the same layer (in both an integrated circuit device and a printed circuit board). This facilitates interconnection layout as well as connections to respective signal input/output circuits.

Figure 14:
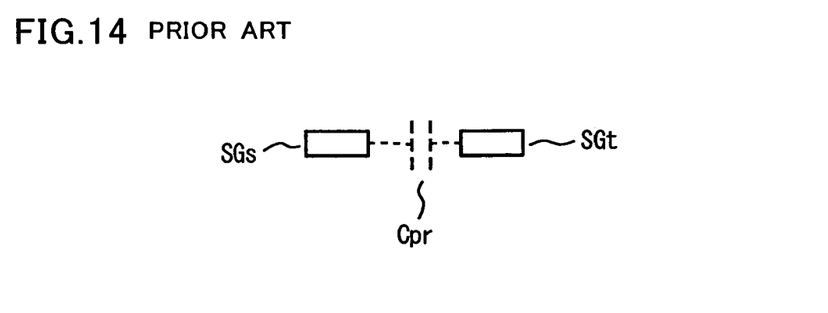
FIG. 14 is a schematic diagram of a parasitic capacitance in the conventional signal bus arrangement.

As shown in FIG. 14, however, there exists a parasitic capacitance Cpr between signal interconnection lines SGs and SGt whichever these bus lines are formed on a printed circuit board or a semiconductor substrate. Here, signal lines SGs and SGt may be any of signal interconnection lines SGA and SGB.

The capacitive coupling of parasitic capacitance Cpr causes cross-talk noise between adjacent signal lines. In case of the capacitive coupling between signals changing in opposite directions, the increase of signal propagation delay, the error of a signal logic level and the like disadvantageously occur. In a dock synchronous system operated synchronously with dock signal CLK, in particular, signals on the signal lines of the same bus are changed synchronously with the dock signal and these signals are, therefore, changed substantially at the same timing, so that the cross-talk noise problem becomes more significant.

To reduce the cross-talk noise, it is necessary to widen a bus line pitch to reduce parasitic capacitance Cpr, which disadvantageously increases a bus layout area. Particularly, when the bus line pitch is widened, recent demand for high integration and down-sizing of a system through narrowing a bus line pitch due to miniaturization cannot be satisfied. The cross-talk noise problem derived from the narrowed line pitch as stated above is common to all the bus arrangement on the printed wiring board, that on the semiconductor integrated circuit device and others.

Further, the above-stated system is not limited to a processing system including a processor and memory units. Even a system having a plurality of processors is encountered with the above-stated cross-talk noise problem if a plurality of individual and separate signal buses are arranged in the system.

SUMMARY OF THE INVENTION

It is an object of the present invention to provide signal bus arrangement capable of reducing cross-talk noise without widening a bus interconnection line pitch.

In a signal bus arrangement according to the present invention, a plurality of signal buses each having a plurality of signal lines are provided, and a signal line of different signal bus is arranged between an adjacent signal line pair.

Preferably, the different signal buses of the plurality of signal buses transmit signals changed at different timing with each other, and the signal lines of the same bus transmit the signals changed substantially at the same timing.

The signal lines of different signal buses among the plural signal buses transmit the signals changed at different timings. Accordingly, when a signal on a signal line of one signal bus is changed, signals on the other signal buses are already driven in a definite state and function as so-called shield interconnection line. Thus, it is possible to reduce the cross-talk noise between the signals changed substantially at the same timing.

Further, only the arrangement of the buses is changed and there is no need to widen a bus interconnection line pitch. It is, therefore, possible to suppress cross-talk noise without changing the bus interconnection line pitch.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIRST EMBODIMENT

Figure 1A:
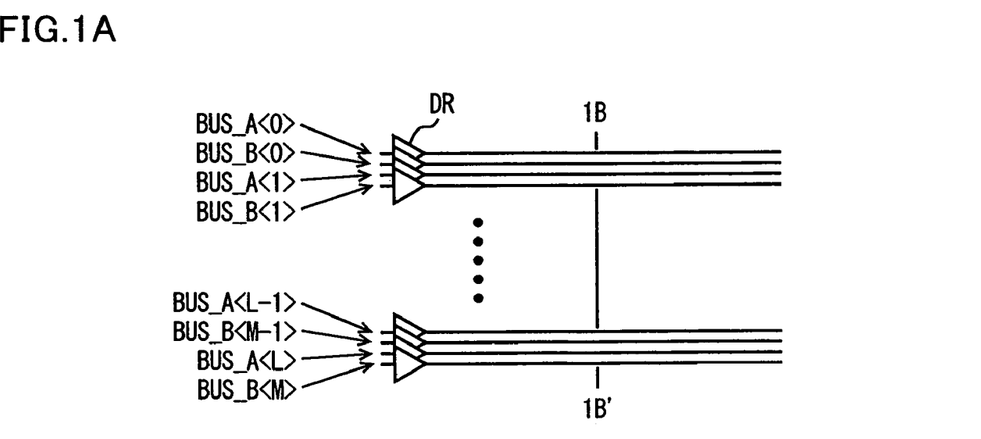
FIG. 1A shows a signal bus arrangement in a first embodiment according to the present invention.

FIG. 1A is a schematic diagram of a signal bus arrangement in the first embodiment according to the present invention. In FIG. 1A, bus lines BUS_A<0:L> and BUS_B<0:M> are arranged. In this bus arrangement, signal lines BUS_A<0> to BUS_A<L> of a bus BUS_A and signal lines BUS_B<0> to BUS_B<M> of a bus BUS_B are alternately arranged. Specifically, a signal line BUS_B<k> of bus BUS_B is arranged between a pair of signal lines BUS_A<j> and BUS_A<j+1> of bus BUS_A.

Signal lines BUS_A<L:0> of bus BUS_A transmit signals changed substantially at the same timing. Signal lines BUS_B<M:0> of bus BUS_B transmit signals changed substantially at the same timing. Buses BUS_A and BUS_B transmit signals changed at different timings. In the description made hereinbelow, the signal lines of the same bus transmit signals changed substantially at the same timing and different buses transmit signals changed substantially at different timings, unless otherwise mentioned.

Buses BUS_A and BUS_B may be buses of signal lines coupled to different devices or may be an address bus transmitting address signals and a data bus transmitting data, respectively, for example. It is only required for these buses that different buses transmit signals changed at different timings and that a common bus transmits signals changed substantially at the same timing.

It is noted that drivers DR are arranged for the respective signal lines of buses BUS_A and BUS_B. Drivers DR may be ordinary buffer circuits or repeaters shaping signal waveforms.

Furthermore, buses BUS_A and BUS_B may be constituted of wiring lines or wires on a printed circuit board or of interconnection lines on semiconductor chips in an integrated circuit device. It is assumed that the same is true for the constructions of these bus interconnections in the following embodiments.

Figure 1B:
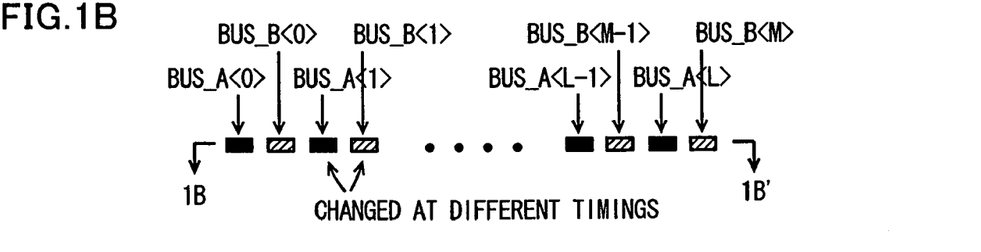
FIG. 1B is a schematic diagram of a cross-sectional structure taken along line 1B–1B' of FIG. 1A.

FIG. 1B is a schematic diagram showing a cross-sectional structure taken along line 1B–1B' of FIG. 1A. As shown in FIG. 1B, signal lines BUS_A<0:L> and BUS_B<0:M> of buses BUS_A and BUS_B are alternately arranged on the same interconnection layer. Here, "interconnection layer" indicates an interconnection layer formed in one manufacturing step with respect to a semiconductor integrated circuit device and indicates a layer on which printed wiring lines or wires formed on a two-dimensional plane are arranged with respect to a printed wiring board. In the following, the term "interconnection line" is used for indicating both an on-chip interconnection line and an on-board interconnection line (wire).

As shown in FIG. 1B, signal lines BUS_A<0:L> and BUS_B<0:M> of buses BUS_A and BUS_B are alternately arranged, and buses BUS_A and BUS_B transmit signals changed at different timing. Wen signals of signal lines BUS_A<0:L> of bus BUS_A are changed, signals of signal lines BUS_B<0:M> of bus BUS_B are in a definite state. Therefore, signal lines BUS_B<0:M> function as shield interconnections against signal lines BUS_A<0:L> of bus BUS_A, to make it possible to reduce cross-talk noise.

In the bus arrangement shown in FIGS. 1A and 1B, only the arrangement order of the signal lines of the buses changes and the interconnection pitch of the buses has no change. Therefore, it is possible to reduce cross-talk noise without widening the bus interconnection line pitch.

In FIG. 1B, signal lines BUS_A<0:L> and BUS_B<0:M> of buses BUS_A and BUS_B are orderly arranged according to the order of bits. However, it suffices that these bus signal lines are arranged such that a signal line of bus BUS_B is arranged between a pair of signal lines of bus BUS_A and that a signal line of BUS_A is arranged between a pair of signal lines of BUS_B. The arrangement order of the signal lines of buses BUS_A and BUS_B may be desirably determined.

Figure 2A:
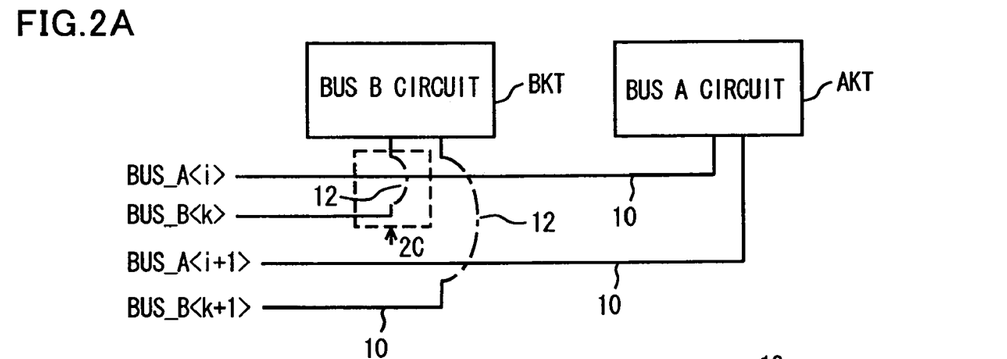
FIG. 2A two-dimensionally shows the connection between signal lines and corresponding circuits in the first embodiment.

FIG. 2A is a schematic diagram of the construction of the section coupled to a circuit in the bus arrangement in the first embodiment according to the present invention. FIG. 2A representatively shows signal lines BUS_A<i> and BUS_A<i+1> of bus BUS_A and signal lines BUS_B<k> and BUS_B<k+1> of bus BUS_B. Signal lines BUS_A<i> and BUS_A<i+1> of bus BUS_A are coupled to a bus A circuit AKT. Signal lines BUS_B<k> and BUS_B<k+1> of bus BUS_B are coupled to a bus B circuit BKT.

These signal lines BUS_A<i:i+1> and BUS_B<k:k+1> are formed of interconnection lines 10 on the same layer. As for bus B circuit BKT, bus signal lines BUS_B<k:k+1> are extended to overpass signal lines BUS_A<i:i+1> at a crossing part 2C using crossing interconnection lines 12 so as to branch the signal lines to the bus B circuit.

Figure 2B:
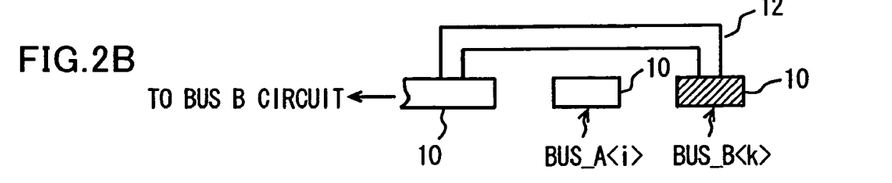
FIG. 2B is a schematic diagram of a cross-sectional structure of FIG. 2A.

FIG. 2B is a schematic diagram of the cross-sectional structure of crossing part 2C shown in FIG. 2A. Bus signal lines BUS_B<k> and BUS_A<i> are formed of interconnection lines 10 on the same interconnection layer. Interconnection line 10 forming the signal line BUS_B<k>, which overpasses another interconnection line 10 forming bus signal line BUS_A<i>, is coupled to other interconnection line 10 coupled to bus B circuit by crossing interconnection line 12. Accordingly, by using crossing interconnection line 12 as shown in FIG. 2B, even if adjacent signal lines are of different buses, the respective signal lines of buses BUS_A and BUS_B can be coupled to their corresponding circuits.

Crossing interconnection line 12 is formed in a manufacturing step different from that for the bus signal lines in the case of the semiconductor integrated circuit device. In the case of the printed circuit board, wiring lines on a different layer in a multi-layer wiring structure are used for the crossing interconnection line.

While crossing interconnection lines 12 are formed on a layer above the interconnection lines 10 in FIG. 2B, they may be formed on a layer below the interconnection lines 10.

Bus A circuit AKT and bus B circuit BKT may be signal output circuits, or signal input circuits, or may be input and output circuits for inputting and outputting signals.

The crossing structure shown in FIGS. 2A and 2B is provided at circuits arranged on each of the both ends of bus BUS_A and BUS_B. Such crossing interconnection lines make it possible to change the arrangement order of bus signal lines without changing the layout of the circuits coupled to the interconnection lines of buses BUS_A and BUS_B.

[Modification]

Figure 3A:
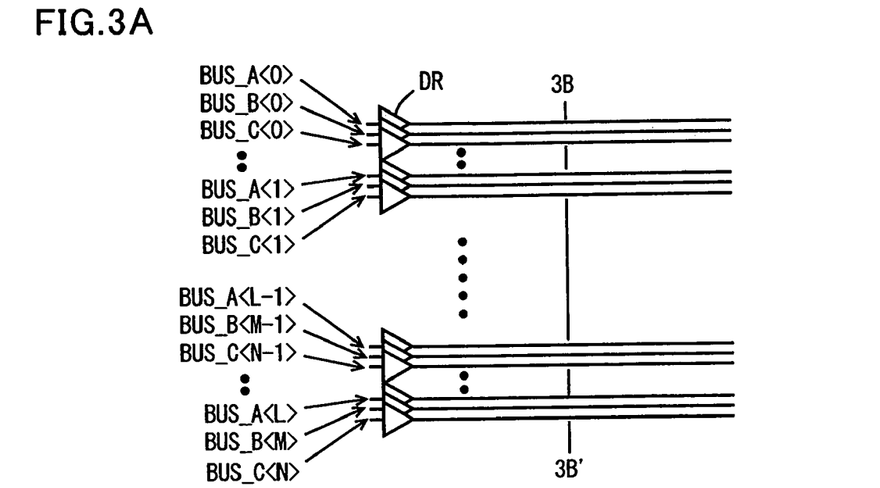
FIG. 3A is a schematic diagram of the planar layout of a signal bus arrangement in the modification of the first embodiment according to the present invention.

FIG. 3A is a schematic diagram of a bus arrangement in the modification of the first embodiment according to the present invention. In FIG. 3A, bus BUS_A of a width of (L+1) bits, bus BUS_B of a width of (M+1) bits and a bus B_C of a width of (N+1) bits are provided. Signal lines BUS_A<0:L>, BUS_B<0:M> and BUS_C<0:N> of the respective buses are sequentially arranged along the bit order. Accordingly, between a pair of signal lines of bus BUS_A, a signal line of the bus BUS_B or BUS_C other than the bus BUS_A is arranged and any adjacent signal line pair consist of the signal lines of different buses. The same holds for the other buses BUS_B and BUS_C. Specifically, a signal line of a certain bus is arranged to be adjacent to the signal lines of buses other than the certain bus.

Figure 3B:
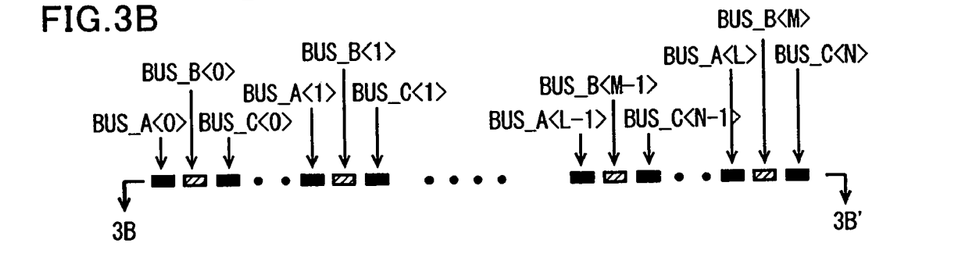
FIG. 3B is a schematic cross-sectional view taken along line 3B–3B' of FIG. 3A.

FIG. 3B is a schematic diagram of a cross-sectional structure taken along line 3B–3B' shown in FIG. 3A. As shown in FIG. 3B, bus signal lines BUS_A<0:L>, BUS_B<0:M> and BUS_C<0:N> are sequentially arranged in the same interconnection layer. The signals of buses BUS_A, BUS_B and BUS_C are changed at different timings in units of buses. Even with the number of buses increasing as shown in this modification, when a signal on a signal line is changed, the signal lines of different buses, arranged on the both sides of the signal line of interest, can be used as shield interconnection lines. It is, therefore, possible to prevent cross-talk.

It is noted that the number of buses is not limited to three, and four or more buses may be provided in the construction shown in FIGS. 3A and 3B. In addition, the arrangement order of the signal lines of each of buses BUS_A, BUS_B and BUS_C may be desirably determined. Further, these bus signal lines may be printed board wiring lines or on-chip interconnection lines.

As stated above, according to the first embodiment of the present invention, the signal lines of different buses are arranged to be adjacent one another. Thus, when the timing in signal change differ in units of buses, it is possible to suppress cross-talk. Besides, only the arrangement order of bus signal lines changes, it is not necessary to widen a bus line pitch and it is possible to suppress the increase of interconnection layout.

SECOND EMBODIMENT

Figure 4A:
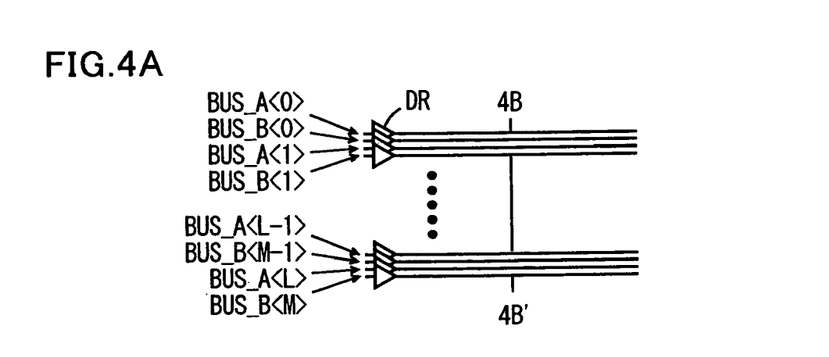
FIG. 4A is a signal bus arrangement in a second embodiment according to the present invention.
Figure 4B:
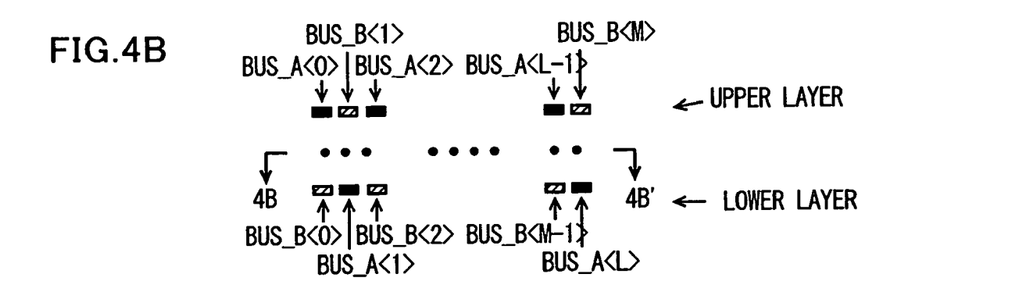
FIG. 4B is a schematic diagram of a cross-sectional structure taken along line 4B–4B' of FIG. 4A.

FIG. 4A is a schematic diagram of a bus arrangement in the second embodiment according to the present invention. FIG. 4B is a schematic diagram of a cross-sectional structure taken along line 4B–4B' of FIG. 4A. In FIG. 4A, buses BUS_A and BUS_B are provided as signal buses. Signal lines BUS_A<0:0> to BUS_A<0:L> of bus BUS_A are arranged to be distributed on two interconnection layers three-dimensionally. Signal lines BUS_B<0> to BUS_B<M> of bus BUS_B are arranged being distributed on two interconnection layers. On the interconnection layer on which signal lines are arranged two-dimensionally, adjacent signal lines are signal lines of different signal buses as in the case of the first embodiment. Here, "three-dimensional arrangement" indicates the bus arrangement of a multi-layer structure in which a plurality of interconnection layers are used to arrange bus signal lines, and "two-dimensional arrangement" indicates a construction in which signal lines are arranged on one interconnection layer. The term "interconnection layer" indicates both the a layer for forming on-chip interconnection lines and a layer for forming wiring lines in a printed board.

As shown in FIG. 4B, in the upper interconnection layer of the multiple interconnection layers in the three-dimensional arrangement, even-number signal lines BUS_A<0>, BUS_A<2>, . . . BUS_A<L–1> of bus BUS_A and odd-number signal lines BUS_B<1>, . . . BUS_B<M> of bus BUS_B are alternately arranged to implement an alternate bus arrangement.

In the lower interconnection layer, even-number signal lines BUS_B<0>, . . . BUS_B<M–1> of bus BUS_B are arranged to be aligned and to face the signal lines of bus BUS_A on the upper interconnection layer. In addition, signal lines BUS_A<1> . . . BUS_A<L> are arranged to be aligned and to alternate with the signal lines of bus BUS_B on the lower interconnection layer, and also arranged to face the signal lines of bus BUS_B on the upper interconnection layer.

Accordingly, in the upper and lower interconnection layers, the signal lines of buses BUS_A and BUS_B are alternately arranged two dimensionally and three dimensionally, whereby it is possible to reduce cross-talk noise without widening a bus line pitch. In addition, since the number of bus signal lines is halved in each interconnection layer, it is possible to increase the pitch between the signal lines in the same bus layout area as in the case of the two-dimensional arrangement, thereby enabling the bus signal lines to be arranged with a sufficient margin. Conversely, if the bus pitch is maintained the same as that of the two-dimensional arrangement, it is possible to reduce a two-dimensional bus layout area.

In the signal line arrangement shown in FIGS. 4A and 4B, it is possible to suppress cross-talk noise on each of the upper and lower layers as in the case of the first embodiment. In FIG. 4A, the arrangement order of the signal lines of the respective buses may be desirably determined on each of the upper and lower interconnection layers. In addition, by facing the signal lines of the buses on the upper interconnection layer with the signal lines of different buses on the lower interconnection layer, it is possible to reduce cross-talk noise generated through capacitive coupling between the upper and lower interconnection layers.

In the signal line arrangement shown in FIG. 4A, the signal lines on the upper and lower interconnection layers are arranged being aligned. Alternatively, the signal lines of the buses may be arranged being displaced from one another on the upper and lower interconnection layers. In that case, it is possible to further reduce the coupling capacitance between the upper and lower interconnection layers.

Furthermore, another interconnection layer may be arranged between these upper and lower interconnection layers, and the upper and lower interconnection layers may not be adjacent to each other in the multi-layer interconnection structure.

It is noted that circuit connection can be established using the same structure as that shown in FIGS. 2A and 2B. If the signal lines of bus BUS_A and the signal lines of bus B are connected to circuits while crossing one another on the upper interconnection layer, for example, a crossing part is formed using a conductive layer above this upper interconnection layer. On the lower interconnection layer, the signal lines of bus BUS_A are coupled to a corresponding circuit while extending over the signal lines of bus BUS_B using a conductive layer below this lower interconnection layer.

If there is an intermediate interconnection layer between the upper and lower interconnection layers, interconnection lines for the crossing of the bus signal lines may be formed using this intermediate interconnection layer.

Alternatively, the following constitution may be used. In a region in which bus signal lines are connected to a corresponding circuit, all of the bus signal lines on the upper layer are formed-on the lower interconnection layer, crossing interconnection lines are formed using the upper interconnection layer in this crossing region, and necessary bus signal lines are connected to the corresponding circuit. Then, bus signal lines are arranged extending again in the multi-layer interconnection structure. In that case, although the number of bus signal lines increases in the crossing region and the layout area of the crossing region increases, there is no need to provide another interconnection layer for crossing interconnection.

[Modification]

Figure 5A:
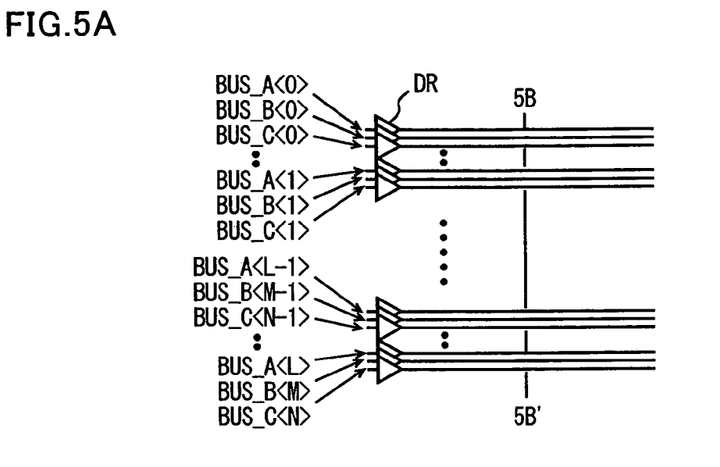
FIG. 5A is a signal bus arrangement in the modification of the second embodiment according to the present invention.
Figure 5B:
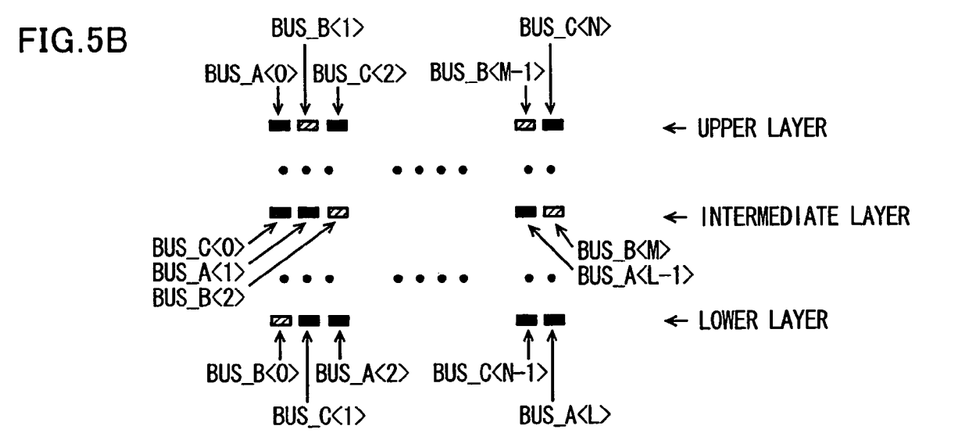
FIG. 5B is a schematic diagram of a cross-sectional structure taken along line 5B–5B' of FIG. 5A.

FIG. 5A is a schematic diagram of a bus arrangement in the modification of the second embodiment according to the present invention. FIG. 5B is a schematic diagram of a cross-sectional structure taken along line 5B–5B' of FIG. 5A. In FIG. 5A, buses BUS_A, BUS_B and BUS_C are arranged. The signal lines of these buses are arranged being distributed into three layers of upper, intermediate and lower layers as shown in FIG. 5B. On each of the upper, intermediate and lower layers, the lines of the respective buses are arranged such that adjacent signal lines are the signal lines of different buses. In addition, the signal lines of different buses are arranged being aligned in the depth direction of the upper, intermediate and lower layers. That is, the adjacent signal lines are signal lines of different buses both two-dimensionally and three-dimensionally.

Even if there are a multiple of buses and the number of bus routs having signals changed at different timings is increased, it is possible to reduce cross-talk noise without widening a bus pitch by increasing the number of interconnection layers of a multi-layer interconnection structure as done in the modification. It is noted that in FIG. 5A, the arrangement order of the signal lines of the respective buses on each of the upper, intermediate and lower interconnection layers may be desirably determined. Further, it is possible to reduce a bus layout area by providing this three-dimensional bus arrangement, as compared with a two-dimensional arrangement.

Furthermore, by increasing the number of interconnection layers according to the number of individual bus routs, signal lines in different buses can be arranged adjacently on each interconnection layer in the depth direction the interconnection arrangement and cross-talk noise generated through the coupling capacitance between these interconnection layers can be reduced even if the upper, intermediate and lower interconnection layers are adjacent to one another in the three-dimensional arrangement.

It is noted that another interconnection layer may be arranged between the upper and intermediate interconnection layers or another interconnection layer may be arranged between the intermediate and lower interconnection layers in the construction shown in FIG. 5B. Besides, while the signal lines are arranged being aligned on each of these upper, intermediate and lower interconnection layers in the depth direction of the bus arrangement in this modification, the signal lines may be arranged being displaced from one another in the depth direction.

Furthermore, with the construction shown in FIGS. 5A and 5B, with the number of bus routs (the number of buses) being K, a bus layout area can be reduced to 1/K times, as compared with a case of arranging the buses two-dimensionally.

As stated above, according to the second embodiment of the present invention, the bus signal lines are arranged such that the signal lines of different buses are adjacent to one another on a two-dimensional plane and the buses are arranged three-dimensionally such that signal lines are arranged, in one interconnection layer, facing the signal lines in different buses in another interconnection layer. Thus, it is possible to reduce cross-talk noise without widening a bus line pitch. This multi-layer interconnection structure allows the bus layout area to be reduced. Further, this three-dimensional structure enables the pitch conditions for the signal lines on the respective interconnection layers to be relaxed and signal lines to be arranged with a margin.

THIRD EMBODIMENT

Figure 6A:
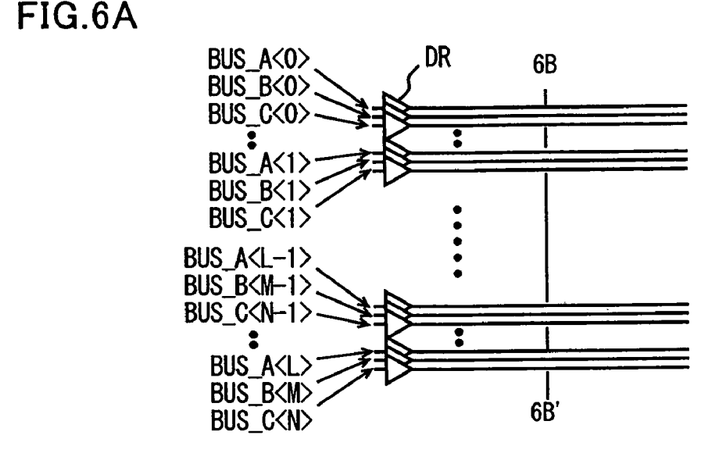
FIG. 6A is a schematic diagram of a signal bus arrangement in a third embodiment according to the present invention.
Figure 6B:
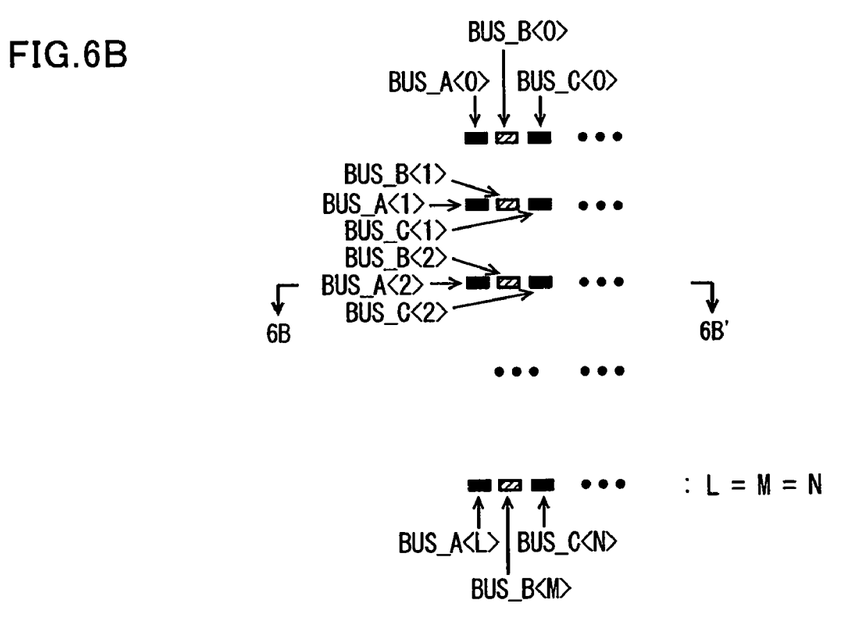
FIG. 6B is a schematic diagram of a cross-sectional structure taken along line 6B–6B' of FIG. 6A.

FIGS. 6A and 6B are schematic diagrams of the planar layout and the cross-sectional structure of a signal bus arrangement in the third embodiment according to the present invention, respectively.

In FIG. 6A, buses BUS_A, BUS_B and BUS_C include signal bus lines BUS_A<0:L>, BUS_B<0:M> and BUS_C<0:N>, respectively. These buses BUS_A, BUS_B and BUS_C are the same in bit width, i.e., L=M=N.

In a planar layout, adjacent signal lines are included in different buses. As shown in FIG. 6B, the signal lines of buses BUS_A, BUS_B and BUS_C are arranged being distributed in the interconnection layers as many as the bit width. In each interconnection layer, the signal lines of BUS_A, BUS_B and BUS_C are arranged being aligned. In the depth direction, the bus signal lines BUS_A<0:L> of bus BUS_A are arranged being aligned, the bus signal lines BUS_B<0:M> of bus BUS_B are arranged being aligned and the bus signal lines BUS_C<0:N> of bus BUS_C are arranged being aligned.

In this case, therefore, by arranging the bus signal lines three-dimensionally, it is possible to further reduce the layout area of the buses. In addition, in the three-dimensional arrangement, the bus signal lines are the same in number as the interconnection layers. Therefore, by arranging the signal lines being distributed in the interconnection layers for each respective bus, it is possible to readily arrange the signal lines of different buses to be adjacent one another in the two-dimensional layout. Further, since the signal lines of the same bus are formed in the different interconnection layers, it is possible to reduce the inter-line capacitance by using interlayer insulating layers, to further reduce cross-talk noise components.

In the signal arrangement shown in FIG. 6B, one or more different interconnection layer(s) may be arranged between immediately adjacent signal interconnection layers and the arrangement order of bus signal lines BUS_A<0:L>, BUS_B<0:M> and BUS_C<0:N> with respect to bits may be desirably determined.

Further, while the bus signal lines are arranged being aligned in the depth direction in this embodiment, the signal lines of the same bus may be arranged to be displaced in the depth direction.

Figure 6C:
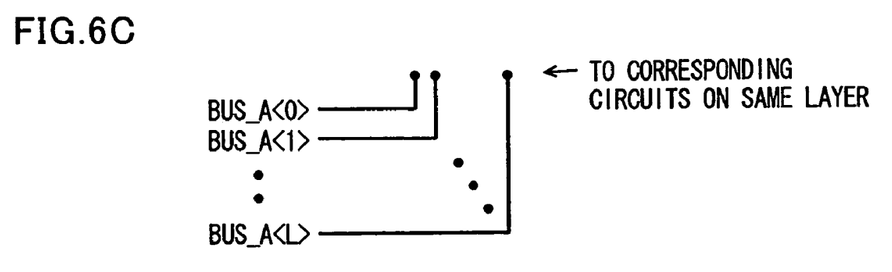
FIG. 6C is a schematic diagram of the constitution of signal lines and that of the connection section of a corresponding circuit in the second modification.

As shown in FIG. 6B, if the bus signal lines of the respective buses are arranged being distributed in the interconnection layers, crossing interconnection line as shown in the previous first and second embodiments are not required in a connection section for connection to corresponding circuits. Specifically, as shown in FIG. 6C, signal lines BUS_A<0> to BUS_A<L> of bus BUS_A, for example, are extended to the same connection interconnection layer while sequentially shifting the positions of their via holes. It is possible to connect the signal lines of bus BUS_A to a corresponding circuit using the interconnection lines of this connection interconnection layer without crossing the signal lines of the other buses. In this case, there is no need to provide a connection dedicated interconnection layer. Specifically, in the interconnection layout shown in FIG. 6C, the connection of the signal lines to the corresponding circuits can be established through interconnection lines formed in an appropriate intermediate interconnection layer or through interconnection lines formed in the uppermost or lowermost interconnection layer in the three-dimensional bus arrangement.

In this third embodiment as in the case of the previous embodiments, buses BUS_A, BUS_B and BUS_C may be printed board wiring lines or internal interconnection lines in a semiconductor integrated circuit.

As stated above, according to the third embodiment of the present invention, the bus signal lines are arranged being distributed in the interconnection layers that are the same in number as the bit width of the buses. It is, therefore, possible to reduce cross-talk noise without widening a bus line pitch. Further, because of the multi-layer structure, it is possible to relax the pitch condition between different buses in the interconnection layout and to connect the signal lines to the corresponding circuits without a crossing part.

It is noted that the number of these buses is not limited to 3 and may be 2 or more than 4.

FOURTH EMBODIMENT

Figure 7:
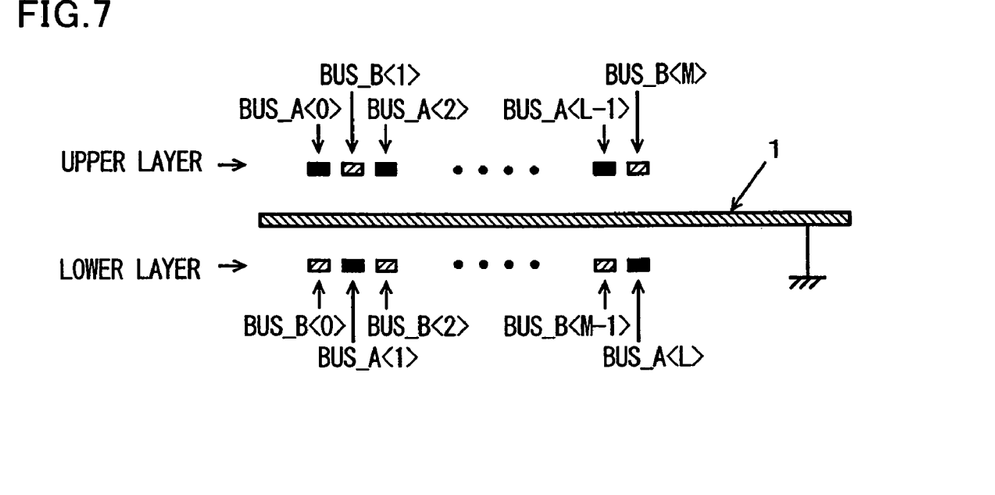
FIG. 7 is a schematic diagram showing the construction of a signal bus arrangement in a fourth embodiment according to the present invention.

FIG. 7 is a schematic diagram of a signal bus arrangement in the fourth embodiment according to the present invention. In FIG. 7, the signal lines of buses BUS_A and BUS_B are alternately arranged on each of upper and lower interconnection layers. In a depth direction, the signal lines are arranged such that the signal lines of bus BUS_A face the signal lines of bus BUS_B each other. A base layer 1 fixed to a ground voltage level, for example, is arranged between the upper and lower interconnection layers. In the case of a printed wiring board, for example, base layer 1 is constituted of a plate of a single conductive layer that is not patterned. In the case of a semiconductor integrated circuit, base layer 1 is formed, for example, by depositing a conductive layer between the upper and lower interconnection layers so as to function as a shield plate.

Base layer 1 is fixed to, for example, the ground voltage level and functions as a shield plate, and the capacitive coupling between the upper and lower interconnection layers can be reduced. Since base layer 1 functions as a shield plate, no other interconnection layers exist between the upper interconnection layer and base layer 1 and between the lower interconnection layer and base layer 1.

Since base layer 1 is made to function as a shield plate, it is possible to prevent the capacitive coupling between the signal lines in the upper interconnection layer and the signal lines in the lower interconnection layer and to reduce cross-talk noise. Besides, in each of these upper and lower interconnection layers, the signal lines of different buses are alternately arranged, so that the same advantage as that in the second embodiment can be provided. It is noted that base layer 1 may be fixed not to the ground voltage level but to a power supply voltage level or other reference voltage level.

[First Modification]

Figure 8:
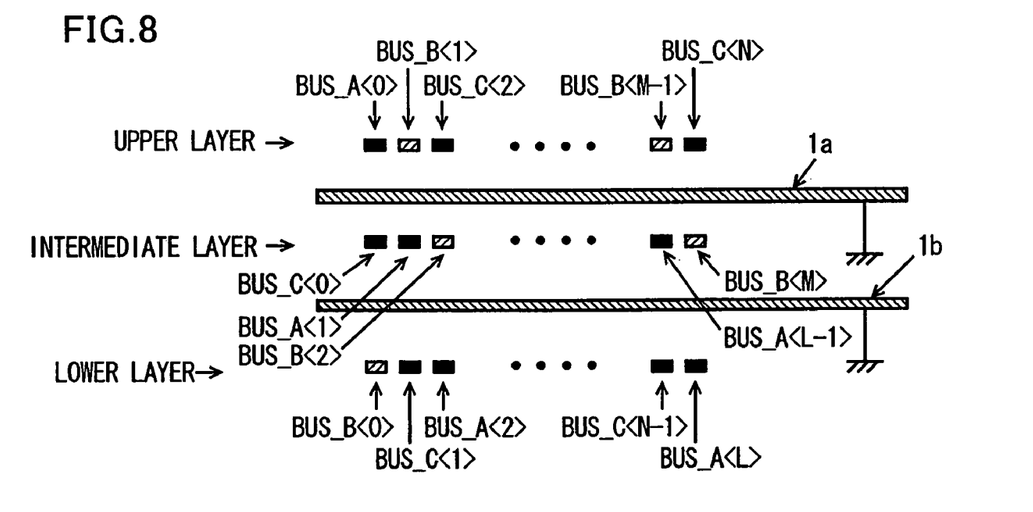
FIG. 8 is a signal bus arrangement in the first modification of the fourth embodiment according to the present invention.

FIG. 8 is a schematic diagram of a signal bus arrangement in the first modification of the fourth embodiment according to the present invention. Similarly to the bus arrangement shown in FIG. 5, in the signal bus arrangement shown in FIG. 8, signal lines of buses BUS_A, BUS_B and BUS_C are arranged being distributed in upper, intermediate and lower interconnection layers. A base layer 1a fixed to, for example, the ground voltage level is arranged between the upper and intermediate interconnection layers and a base layer 1b fixed to, for example, the ground voltage level is arranged between the intermediate and lower interconnection layers. Since the signal bus arrangement shown in FIG. 8 is the same as that shown in FIG. 5, corresponding parts are denoted by the same reference numerals as those in FIG. 5 and no detailed description will be repeated.

By arranging base layers 1a and 1b each fixed to, for example, the ground voltage level between the upper and intermediate interconnection layers and between the intermediate and lower interconnection layers, respectively, it is possible to prevent the capacitive coupling between the signal lines in the upper interconnection layer and the signal lines in the intermediate interconnection layer, and the capacitive coupling between the signal lines in the intermediate interconnection layer and the signal lines in the lower interconnection layer. Accordingly, by allowing base layers 1a and 1b to function as shield plates, it is possible to suppress the occurrence of noise through the capacitive coupling between any interconnection layers and to further reduce cross-talk noise.

Since base layers 1a and 1b function as shield plates, no interconnection layer in which signal lines transmitting signals are formed exists between the upper and intermediate interconnection layers and no interconnection layer in which other signal lines are formed exists between the intermediate and lower interconnection layers. Thus, it is possible to cause base layers 1a and 1b to accurately function as shield plates for the upper, intermediate and lower interconnection layers, to reduce coupling noise between the interconnection layers, and to further reduce cross-talk noise between the signals of buses BUS_A, BUS_B and BUS_C.

[Second Modification]

Figure 9:
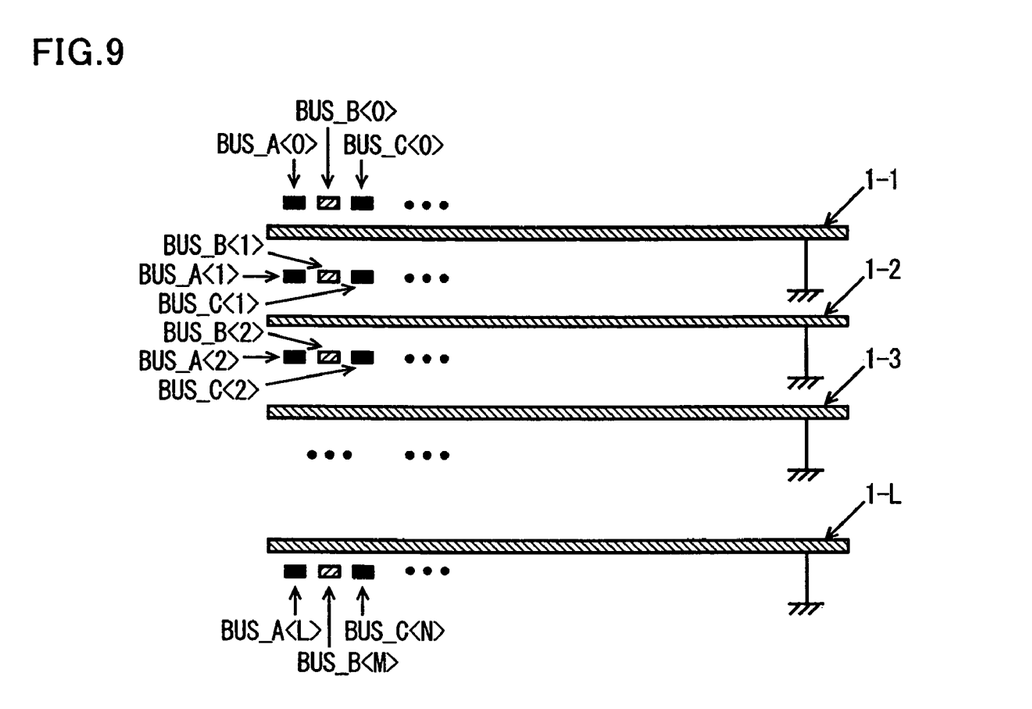
FIG. 9 is a schematic diagram of a signal bus arrangement in the second modification of the fourth embodiment according to the present invention.

FIG. 9 is a schematic diagram of a signal bus arrangement in the second modification of the fourth embodiment according to the present invention. The signal line arrangement shown in FIG. 9 is the same as that shown in FIG. 6B. Specifically, signal lines of buses BUS_A, BUS_B and BUS_C are arranged being distributed in the interconnection layers and the number of the interconnection layers is equal to the bus width of these buses. In the signal bus arrangement shown in FIG. 9, base layers 1-1 to 1-L each fixed to, for example, the ground voltage level are arranged in respective regions between interconnection layers. Since the other construction is the same as that shown in FIG. 6B, corresponding parts are denoted by the same reference numerals and no detailed description will be given thereto.

With the construction shown in FIG. 9, no interconnection layers for arranging signal lines are provided between the base layers and corresponding interconnection layers. This arrangement reliably allows base layers 1-1 to 1-L to function as shield plates.

In the case of the signal bus arrangement shown in FIG. 9, base layers 1-1 to 1-L function as shield plates. Therefore, it is possible to suppress the coupling noise between any interconnection layers, besides the advantages of the previous third embodiment.

In the signal bus arrangements shown in FIGS. 8 and 9, base layers 1a, 1b and 1-1 to 1-L are fixed to the ground voltage level. Alternatively, base layers 1a, 1b and 1-1 to 1-L may be fixed to a power supply voltage level, or may be selectively fixed to the ground potential level or the power supply voltage level. Further, in a semiconductor integrated circuit device, for example, base layers 1, 1a, 1b and 1-1 to 1-L may be fixed to a stable internal voltage level used internally in the case of a memory device or the like. It suffices that base layers 1, 1a, 1b and 1-1 to 1-L are always fixed to a predetermined voltage level.

As stated above, according to the fourth embodiment of the present invention, the base layer fixed to a predetermined voltage level is arranged between the interconnection layers in the multi-layer interconnection structure. It is, therefore, possible to reduce the capacitive coupling between the interconnection layers and to prevent the noise between the interconnection layers to reduce a signal propagation delay due to the capacitive coupling between the interconnection layers.

OTHER EMBODIMENTS

Buses BUS_A, BUS_B and BUS_C may be coupled to different target devices, respectively. Alternatively, buses BUS_A, BUS_B and BUS_C may be an address bus transmitting address signals, a control bus transmitting control signals and a data bus transmitting data, respectively.

The number of buses is appropriately determined. The signal lines of different buses are merely required to meet the requirement that the different buses transmit signals changed at different timings.

Furthermore, bus interconnection lines may be interconnection lines in a semiconductor integrated circuit device, on a printed wiring board or in a module.

As stated so far, according to the present invention, the signal line arrangement is constructed such that signal lines of different buses are arranged to be adjacent one another at least in the two-dimensional arrangement and the different buses are different in signal change timing. It is, therefore, possible to reduce the cross-talk noise between the signal lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal bus arrangement comprising:

a plurality of signal buses each having a plurality of signal lines, said plurality of signal buses arranged such that a signal line of a first signal bus is arranged between and adjacent a pair of signal lines of a second signal bus, a signal on the signal line of said first bus being in a definite state of having an unchanged, stable voltage level in a period during which signals on the signal lines of said second bus change, and vice versa; and wherein said plurality of signal buses are arranged three-dimensionally in a plurality of layers, while adjacent signal lines in a two-dimensional arrangement are included in different signal buses.

2. The signal bus arrangement according to claim 1, wherein said plurality of signal buses are equal in bit width; and
said plurality of layers are equal in number to the bit width of said plurality of signal buses.

3. The signal bus arrangement according to claim 1, wherein the signal lines arranged corresponding to one another in a depth direction in adjacent interconnection layers are included in different buses.

4. The signal bus arrangement according to claim 1, further comprising, in the three-dimensional arrangement, a conductive layer fixed to a predetermined voltage provided between two-dimensional layers each having the signal lines arranged therein.

5. The signal bus arrangement according to claim 4, wherein said conductive layers is arranged between each respective pair of the adjacent two-dimensional layers of the signal lines formed therein.

6. A signal bus arrangement comprising:

a plurality of signal buses each having a plurality of signal lines said plurality of signal buses arranged such that a signal line of a first signal bus is arranged between and adjacent a pair of signal lines of a second signal bus a signal on the signal line of said first bus being in a definite state of having an unchanged, stable voltage level in a period during which signals on the signal lines of said second bus change and vice versa; and wherein said plurality of signal buses are on-board wiring buses on a printed board.

7. A signal bus arrangement comprising:

a plurality of signal buses each having a plurality of signal lines said plurality of signal buses arranged such that a signal line of a first signal bus is arranged between and adjacent a pair of signal lines of a second signal bus a signal on the signal line of said first bus being in a definite state of having an unchanged, stable voltage level in a period during which signals on the signal lines of said second bus change and vice versa; and wherein said plurality of signal buses are comprised of on-chip interconnection lines formed on a semiconductor chip.

* * * * *